(12) United States Patent
Chen et al.

(10) Patent No.: US 7,728,304 B2
(45) Date of Patent: Jun. 1, 2010

(54) METHOD OF MAKING SEGMENTED CONTACTS FOR RADIATION DETECTORS USING DIRECT PHOTOLITHOGRAPHY

(75) Inventors: Henry Chen, Victoria (CA); Serguei Roupassov, Victoria (CA); Salah Awadalla, Victoria (CA)

(73) Assignee: Redlen Technologies, Sidney, British Columbia (CA)

( * ) Notice: Subject to any disclaimer, the term of this patent is extended or adjusted under 35 U.S.C. 154(b) by 474 days.

(21) Appl. No.: 11/633,091

(22) Filed: Dec. 4, 2006

(65) Prior Publication Data

US 2007/0194243 A1 Aug. 23, 2007

Related U.S. Application Data

(63) Continuation-in-part of application No. 11/527,707, filed on Sep. 27, 2006, now Pat. No. 7,223,982.

(30) Foreign Application Priority Data

Feb. 22, 2006 (CA) .................................... 2541256

(51) Int. Cl.
*H01L 27/146* (2006.01)
(52) U.S. Cl. ................................. 250/370.13
(58) Field of Classification Search ............ 250/370.01, 250/370.08, 370.09, 370.13, 239, 370.11, 250/370.12, 370.14, 370.15, 370.1; 257/448, 257/E27.146
See application file for complete search history.

(56) References Cited

U.S. PATENT DOCUMENTS

| | | | |
|---|---|---|---|
| 4,144,090 A | 3/1979 | Franz | |
| 5,677,539 A | 10/1997 | Apotovsky | |
| 5,905,264 A | 5/1999 | Shahar et al. | |
| 5,933,706 A | 8/1999 | James et al. | |
| 6,034,373 A | 3/2000 | Shahar et al. | |
| 6,037,595 A | 3/2000 | Lingren | |
| 6,043,106 A | 3/2000 | Mescher et al. | |
| 6,046,068 A | 4/2000 | Orava et al. | |
| 6,069,360 A | 5/2000 | Lund | |
| 6,175,120 B1 | 1/2001 | Macgregor | |
| 6,215,123 B1 | 4/2001 | Orava et al. | |
| 6,333,504 B1 | 12/2001 | Lindgren | |
| 6,362,484 B1 * | 3/2002 | Beyne et al. | 250/374 |
| 6,410,922 B1 | 6/2002 | Spartiotis et al. | |
| 6,465,860 B2 * | 10/2002 | Shigenaka et al. | 257/442 |
| 6,524,966 B1 | 2/2003 | Wright et al. | |
| 6,212,093 B1 | 4/2003 | Lindsey | |
| 6,765,213 B2 | 7/2004 | Shahar et al. | |
| 7,038,288 B2 | 7/2004 | Lai et al. | |
| 6,781,132 B2 | 8/2004 | Macgregor | |
| 7,576,369 B2 * | 8/2009 | Bui et al. | 257/127 |

(Continued)

FOREIGN PATENT DOCUMENTS

EP 1 156 347 A1 11/2001

(Continued)

*Primary Examiner*—David P Porta
*Assistant Examiner*—Faye Boosalis
(74) *Attorney, Agent, or Firm*—Foley & Lardner LLP

(57) ABSTRACT

A method is provided for fabricating contacts on semiconductor substrates by direct lithography that results in durable adhesion of the electrodes, increased interpixel resistance and the electrodes which act as a blocking contact, thereby providing for improved energy resolution in a resultant radiation detector.

29 Claims, 12 Drawing Sheets

U.S. PATENT DOCUMENTS

| | | |
|---|---|---|
| 2001/0035497 A1 | 4/2001 | Montemont et al. |
| 2002/0066531 A1 | 6/2002 | Ke et al. |
| 2002/0158207 A1 | 10/2002 | Spartiotis et al. |
| 2002/0182716 A1 | 12/2002 | Weisbuch et al. |
| 2003/0173523 A1* | 9/2003 | Vuorela ................. 250/370.13 |
| 2004/0052456 A1 | 3/2004 | Boffi et al. |
| 2005/0167606 A1 | 8/2005 | Harrison et al. |
| 2005/0189474 A1* | 9/2005 | Tomioka ................... 250/214.1 |
| 2005/0230627 A1* | 10/2005 | Protic et al. ............ 250/370.01 |
| 2006/0255280 A1* | 11/2006 | Shibayama ............ 250/370.11 |
| 2008/0042070 A1* | 2/2008 | Levin ..................... 250/370.13 |

FOREIGN PATENT DOCUMENTS

JP          02129969 A   *   5/1990

* cited by examiner

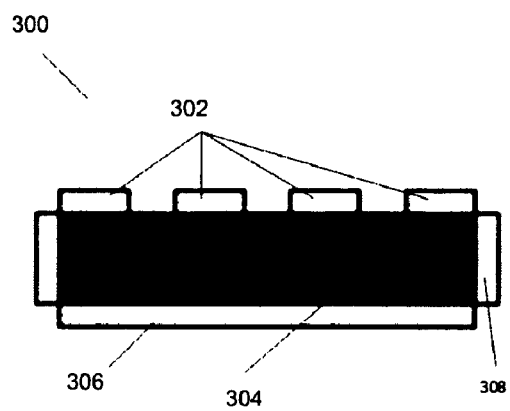
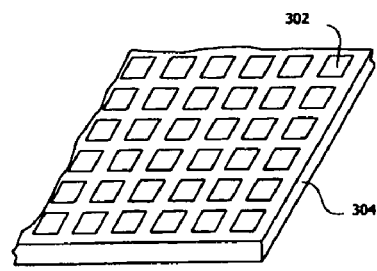
Fig. 4a
Fig. 4b
Fig. 4d
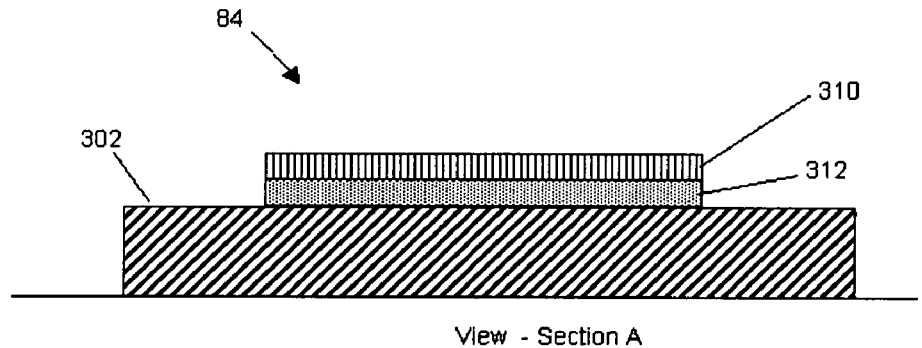
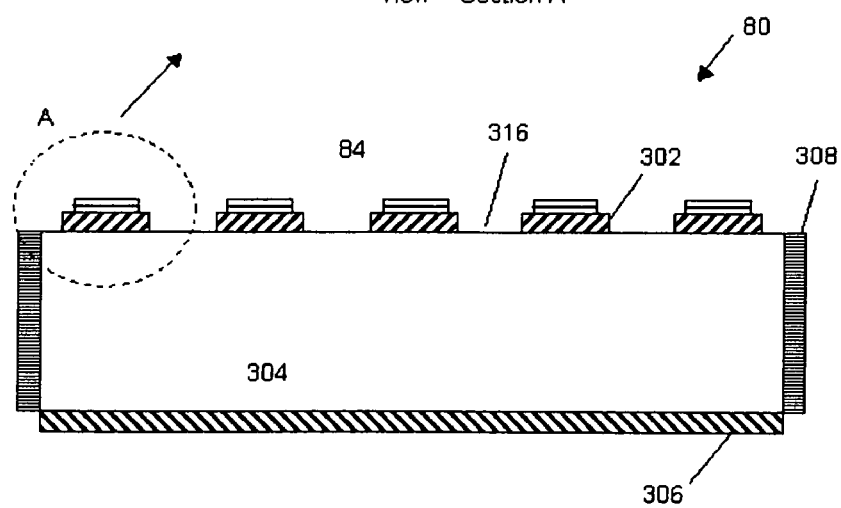
Fig. 4c

METHOD OF MAKING SEGMENTED CONTACTS FOR RADIATION DETECTORS USING DIRECT PHOTOLITHOGRAPHY

CROSS-REFERENCE TO RELATED APPLICATIONS

This application is a continuation-in-part of U.S. application Ser. No. 11/527,707 filed Sep. 27, 2006, which claims benefit of priority of Canadian application number 2,541,256, filed on Feb. 22, 2006, both of which are incorporated herein by reference in their entirety.

TECHNICAL FIELD

The present invention pertains generally to methods for improving the performance of detectors for gamma-ray and X-ray spectrometers and imaging systems, and more particularly to a method of fabricating pixilated CdZnTe detectors having excellent electrode adhesion, low interpixel leakage current and increased spectral performance.

BACKGROUND OF THE INVENTION

The general requirement for room temperature operation of a semiconducting material as a nuclear detector and spectrometer is relatively large band gap energy such that thermal generation of charge carriers is kept to a minimum. Conversely, the requirement for high resolution is small band gap energy such that a large number of electron-hole pairs are created for an absorbed quantum of ionizing radiation. The material under consideration should also have a relatively high average atomic number if used in gamma ray spectroscopy to increase the gamma ray interaction probability. High charge carrier mobilities and long charge carrier lifetimes are also needed to ensure efficient charge carrier extraction and minimal effects from position-dependent charge collection. Detectors fabricated from Cadmium Zinc Telluride (CZT) meet these requirements and are used for gamma and X-ray detection. However, in addition to excellent bulk properties of the CZT single crystal, the fabrication process and structure to create the detector having electrode charge contacts is very critical to high performance of the detector device.

Metal/semiconductor contact plays an important role in determining the performance of the CZT detector device. A good metal/semiconductor contact preferably has all of the following properties, especially for a segmented detector:
  a. Good adhesion.
  b. Capable of preventing charge injection.
  c. Capable of preventing the inclusion of "oxides" beneath the metal—an intermediate oxide layer sandwiched in between the metal and the CZT will lower the barrier height and potentially cause polarization, having a negative effect on detector performance.
  d. Reliable for assembly processes, including low temperature soldering.

Heretofore these criteria have not been met in conventional CZT radiation detector technology. CdZnTe (CZT), and particularly $Cd_{(1-x)} Zn_x Te$ (where x is less than or equal to 0.5), is a wide band gap ternary II-VI compound semiconductor that, because of its unique electronic properties, is desirable for use in gamma-ray and X-ray spectrometers that operate at room temperature for nuclear radiation detection, spectroscopy and medical imaging applications. However, the performance of gamma-ray and x-ray segmented radiation detectors used in imaging applications and fabricated from CZT crystals is often limited because conventional fabrication processes do not achieve all four of the desired contact properties. Typically these devices have pixilated electrode arrays fabricated from various deposition and lithography processes with a gap between pixels, called the interpixel gap or region. Interpixel leakage currents act as a source of noise that reduces the ability of these spectrometers to resolve spectrally the unique radiological emissions from a wide variety of radioactive isotopes—i.e. the energy resolution (ER). The so-called interpixel resistance is a key limitation to performance and is typically much lower than overall device resistivity. Thus, in order to improve the spectral resolution capability of devices based on CZT crystals it is desirable to decrease interpixel leakage currents and the attendant detrimental noise effects.

It is known that for a semiconductor crystal to function effectively as a good detector material (i.e., minimizing interpixel surface leakage currents, thereby maximizing energy resolution) the crystal surfaces in the interpixel gap should have resistivity equal or higher than that of the bulk crystal. Generally, the interpixel surface quality is a function of the metal selected, deposition process and lithography process.

A small number of companies worldwide currently produce CZT detectors commercially in a variety of sizes and thicknesses. Usually one or both sides of the planar detectors are contacted with a continuous metal layer such as gold (Au) or platinum (Pt). As mentioned above, such detector substrates then need to be processed to produce a detector having a pattern of segmented contacts (e.g. pixel pads) on one surface, with the opposite surface remaining uniformly metallized. This is done so that the detector is able to produce a detector output indicating the position at which radiation impacts the detector.

It be believed that commercial pixilated or segmented CZT devices have been fabricated by the inverse lithography (or "lift off") method, with its inherent performance limitations. Also, conventional deposition and lithography processes do not effectively prevent the inclusion of "oxides" beneath the metal during the process, which has a deleterious effect on device band gap. For the specific case of CZT and gold electrodes, it is not known how to use gold contact fabrication with direct photolithography such that the resulting contacts provide good adhesion and stable excellent detector performance at the same time. Poor adhesion of metal electrodes frequently causes very serious electrode lift-off problems leading to failure of the device and limited long-term reliability. Others have found that the surface resistivity of cadmium-based substrates is degraded when the substrate is exposed to conventional metal etchants and etching processes suitable for removing gold. As a result of this, the electrical separation of the individual contacts which results from the conventional method of forming contacts is not as good as would have been expected from the bulk properties before treatment. The inverse-lithography process can be used to reduce etching damage, but has not resulted in excellent interpixel resistivity combined with adequate gold adhesion of the contacts, due to limitations of the process. An example of the inverse-lithography process is U.S. Pat. No. 6,410,922, which requires additional passivation layers to facilitate the lift-off of the interpixel gap and the electrodes to overlap the passivation material. The poor contact adhesion provided by this method makes conventional attachment by methods such as low temperature soldering difficult.

There is a need to reduce the interpixel surface leakage current in CZT crystals fabricated with metal electrodes by increasing interpixel resistance in order to improve spectral resolution. There is also a need for an enhanced contact-forming process demonstrating excellent adhesion to the CZT surface, creating an electrode that is blocking and that does not introduce oxides between the metal and CZT.

Additionally, there is a need for contact-forming processes to deposit additional electrode layers on the fabricated CZT with metal electrodes, without adversely affecting device performance or reducing the interpixel resistance further, to provide suitable contact surface for electronic read-out circuitry attachment.

SUMMARY OF THE INVENTION

According to one aspect of the invention, a method of making a semiconductor radiation detector comprises providing a semiconductor single crystal substrate comprising first and second major planar opposing surfaces, forming a pixilated anode electrode array on the first major opposing surface by direct lithography, and forming a cathode electrode on the second major opposing surface.

According to another aspect of the invention, a radiation detector device comprises a high resistivity, flat CZT bulk crystal substrate, formed as a substantially flat wafer substrate having front and rear surfaces, a segmented array of pixilated anode electrodes comprising a gold contact layer formed on the rear substrate surface such that substantially all gold material in interpixel gaps between the anode electrodes is removed and such that substantially no oxide layer is present between the substrate and the gold contact layer, and a cathode electrode formed on a front substrate surface. The device resistivity is $>5\times10^{10}$ $\Omega$-cm and interpixel resistance is $>2\times10^{9}$ $\Omega$.

Equivalent Definitions:

Electroless deposition: chemical deposition which involves the deposition of a metallic coating on a component by chemical means rather than by electroplating; the component is immersed in a solution containing a reducing agent.

Cathode electrode: the electrode on one major surface of the detector substrate (herein called the front surface) where incident gammas enter the detector, i.e. positioned towards the radiation source.

Anode electrodes: segmented electrode contacts located on the rear surface of the substrate, i.e. positioned away from the radiation source.

Interpixel or inter pixel: the region or gap separating pixel electrodes. Preferably, there is no contaminants or remaining gold in this region or gap. For electrode configurations with non-pixellated discrete contact segments the term is equivalently applied to the gap between contact segments.

BRIEF DESCRIPTION OF THE DRAWINGS

FIG. 4: DEVICE STRUCTURE: This figure illustrates a) sectional view of a CZT device with single layer electrodes and b) perspective view of the tile and c) and d) are an expanded view of a pixel electrode section showing additional contact layers for PCB assembly.

DETAILED DESCRIPTION OF THE INVENTION

Figure 1:
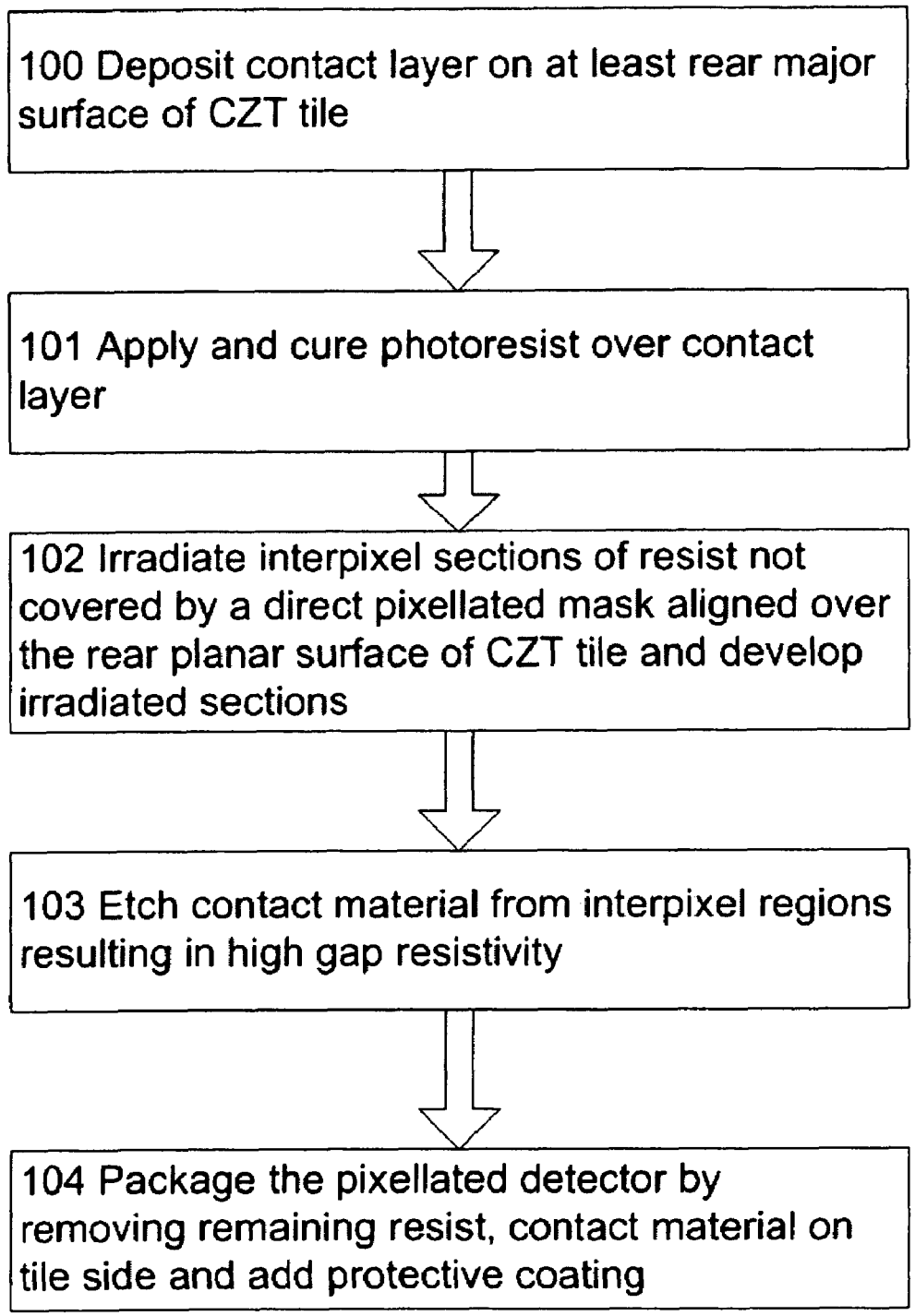
FIG. 1: ELECTRODE FABRICATION METHOD USING DIRECT PHOTOLITHOGRAPHY: This figure shows the basic process of forming single layer contacts with high interpixel resistance.
Figure 2A:
FIG. 2: DETAILED ELECTRODE FABRICATION METHOD AND DEVICE STRUCTURE: This figure illustrates a cross-section schematic representation of the changes in structure for a device with three contact layers.
Figure 2B:
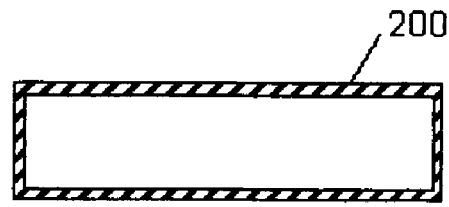
Figure 2C:
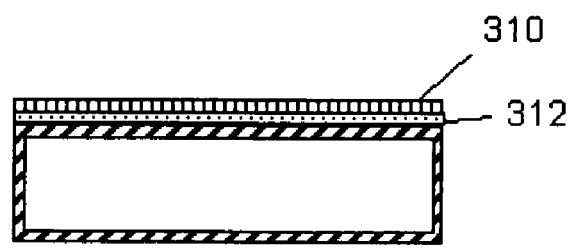
Figure 2D:
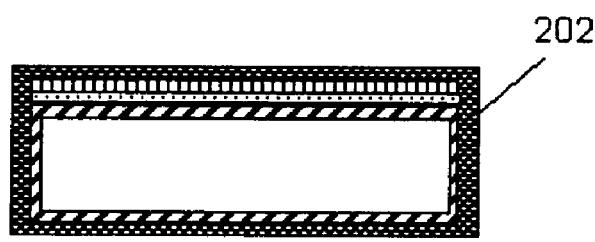
Figure 2E:
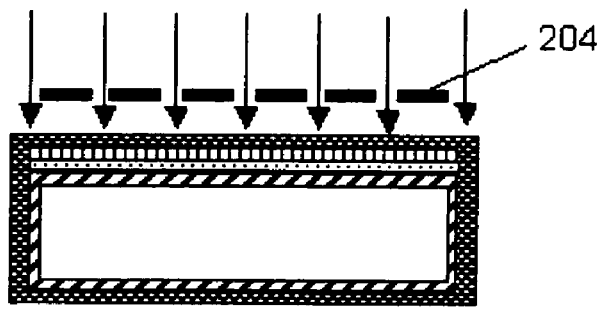
Figure 2F:
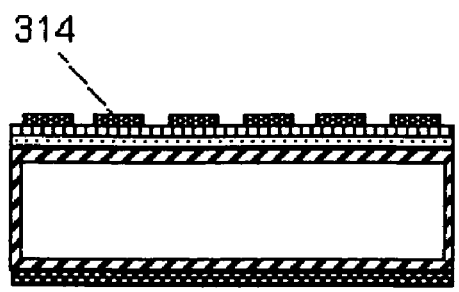
Figure 2G:
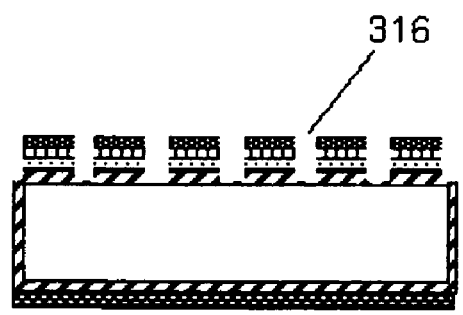
Figure 2H:
Figure 2I:
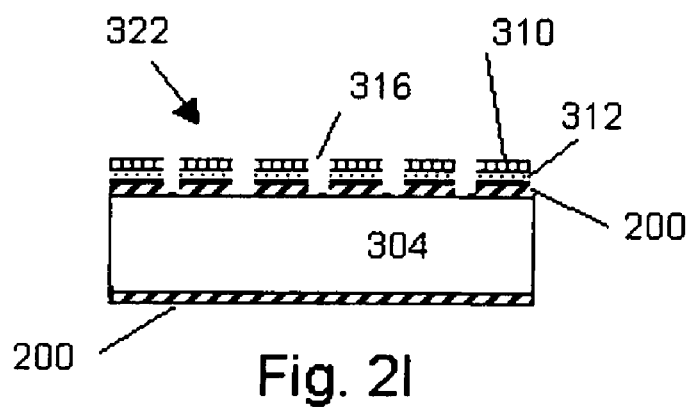

It is believed that commercial, high performance pixilated CZT detectors with gold contacts have not been fabricated with a direct lithography method. By this direct lithography method a contact layer can be deposited without contamination and with fewer adhesion issues. The gaps between the pixels can be exposed in the photolithography process and etched. The advantages of a direct lithography process in which the unwanted metal is removed are good device performance and excellent electrode adhesion. However, specifically for the case of gold deposited as the electrode material and processed in a direct lithography process, there is a challenge to remove substantially all the gold from the interpixel gap between electrodes to eliminate undesirable surface features and to minimize surface damage.

The present invention embodiments provide a method for fabricating pixilated imaging detectors via a direct lithography technique, resulting in a high value of interpixel resistivity and durable adhesion, substantially no oxide layer (i.e., completely no oxide layer or having an unavoidable trace amount of oxide, but not discrete oxide layer) and providing a blocking contact. When used for radiation detection, the planar electrode will be positioned facing the radiation source. The planar electrode will be referred to as being on the front device surface, and the pixel array electrodes as being on the rear device surface. The process disclosed herein comprises depositing contact electrode layers on at least the rear surfaces of the CZT tile, then forming pixel electrodes on the rear detector surface by applying a resist on at least said rear detector surface contact layer and exposing resist covering selected interpixel regions using a direct photolithography mask covering, then etching said exposed interpixel resist regions with an etchant to remove substantially all deposited contact material in the interpixel gap regions, and finally stripping the remaining resist.

Fabrication methods are provided that produce excellent detector performance, particularly for CZT, due to the fabrication technique and method of removing the contact material in the gap region between contact segments (in the pixilated example, called the interpixel gap). Specifically, the direct lithography process provides an optimized metal/semiconductor contact such that it not only provides excellent adhesion but also precludes oxidation at the metal/semiconductor interface as well as providing a semi-blocking contact that prevents charge injection. Furthermore, the metal removal method provides a stable and high resistance interpixel region such that the interpixel leakage current is minimized. Additionally, the forming process ensures reliability during assembly and use as a radiation detector, especially printed circuit board (PCB) attachment such as by the low temperature soldering technique.

According to another aspect of the present invention, segmented contacts made by the direct lithography process are strongly adhered to the CZT crystal, sufficient to remain adhered when stressed by contacting a region of the electrode surface with Scotch brand adhesive tape then applying sufficient force to peel and remove the tape from the contacted electrode region.

CdZnTe (CZT) crystals, particularly $Cd_{(1-x)}Zn_xTe$ (where x is less than or equal to 0.5) crystals and preferably $Cd_{0.9}Zn_{0.1}Te$ crystals, are useful for fabrication of small, portable, room temperature radiation detectors. The method for fabricating segmented detectors via direct photolithography reduces interpixel surface leakage current, increases interpixel resistance and provides durable adhesion of the metal electrode on the surface of the CZT crystal. Improved energy resolution is the result. A four step process is disclosed, wherein metal is deposited on CZT, a resist is applied and the resist is developed by a direct lithography technique, and interpixel regions are etched to remove metal from the CZT surface, and the remaining resist is removed. While direct photolithography is preferred, other direct lithography methods, such as direct nanoimprint lithography in which the masking layer is indented instead of exposed to radiation, may be used.

The invention finds particular, but not exclusive use, with substrates formed of cadmium telluride (CdTe) or cadmium zinc telluride (CdZnTe). The substrate is preferably a sliced and polished single crystal (such as CZT) wafer material. When the substrate is in a rectangular form with major front and rear surfaces, it is referred to also as "tile." It will be appreciated that the method of the invention can be used with other substrate materials as well. Herein contact or contact material refers to a conductive coating, selected from the group including metals, semiconductors or hybrid conductors (such as silicides). Typically, the conductive contact layer is a metal or metal alloy. Preferably, the metal layer for forming the contacts is applied by a method such as physical deposition (sputtering, evaporation) or chemical deposition methods (electrolytic). Preferably, the metal layer for forming the contacts comprises gold (Au), although other metals, for example platinum (Pt) or indium (In), could also be used.

There are many configurations of electrode arrays and many applications to which the invention may be applied. For example, a monolithic crystal wafer of CZT is fabricated with 11×11 pixels on one side and a planar cathode electrode on the opposite side having dimensions X=20, Y=20, Z=5 mm, which is typical for radiation applications but the process is not limited to a single configuration. 8×8 pixel arrays are also popular and were tested. As CZT is used as the bulk crystal material in the examples, Au is used in the specific recipes and experimental results with additional multi-layers as described, but the method is not limited to gold contacts.

It is believed that interpixel surface leakage has an intrinsic surface leakage component from the monolithic CZT, which is low in high quality CZT, and additional surface leakage from the fabrication process of depositing and removing the contact layer in the interpixel region. Hence the fabrication techniques have a critical effect on interpixel resistance and contact "adhesion", and must be optimized and balanced.

The methods embodied herein are reliable, low cost methods of fabricating high performance imaging-grade large area pixilated CZT detectors using a direct photolithography fabrication technique. In particular, this method is well-suited for multi-layer contacts and for a range of deposition processes, including physical deposition and electroless deposition. CZT detectors, using CZT bulk crystal made by the high quality THM crystal growth process and fabricated by the invented method, have shown new and unmatched high resistivity performance. The techniques can be successfully applied to crystals formed by all other crystal growth processes, resulting in relative improvement over traditional detector fabrication. Excellent contact adhesion is observed due to the avoidance of contamination during direct deposition, improved photolithography and appropriate annealing. Hence, the fabrication method and the resulting fabricated detector array with characteristics resulting from the fabrication are believed to be novel.

Additional configurations of a fabricated radiation detector can be applied at various stages using the process. For example, a basic process would just pixelate the anode side of the crystal substrate with a single contact layer. The opposing side could be optionally fabricated simultaneously or before or after as an additional stage. The preferred configuration uses multiple contact layers for improved contact use in assembly of the radiation detector as explained later. For multi-layers, there are again several process options. Firstly, the multiple layers can be integrated into the direct photolithography process or, alternatively, the additional contact layers can be added after the direct photolithography process, providing flexibility on the positioning and size of the additional layers. Additional processes desired for final configuration and packaging are also described for the resulting detector devices.

A basic single layer fabrication process is shown in FIG. 1, having a deposition step, then a direct photolithography treatment followed by etching the contact material in the interpixel gaps, and finally, resist stripping. Optional steps of side polishing and sealing the sides are included. The method starts in step 100 with applying contact electrode layers by deposition on at least the rear surface of the CZT tile. Preferably all surfaces of the tile are coated. This can be done either by physical deposition or chemical methods such as sputtering or electroless deposition. In this broadest application of the technique there is only a single contact layer. The deposited contact provides a blocking contact that prevents charge injection and hence leads to lower leakage current, and the deposition has no oxide layer between contact and CZT. The combination of these advantages leads to stable and high performance radiation detectors. Then in step 101, pixel electrodes are formed on the rear detector surface by applying a resist on at least the rear detector surface contact layer. In Step 102, a direct mask is aligned to the resist and used to selectively expose the interpixel regions to a UV source. The exposed resist is developed at this step, as will be described further on. The contact material in the interpixel gaps is removed by etching in step 103. For demonstrative purpose, if gold is the contact, then the exposed interpixel resist regions are etched with a bromine-based etchant and process to remove substantially all deposited gold contact in the interpixel gap regions. A suitable photolithography and etch process results in stable interpixel surface with high resistivity, leading to low interpixel leakage current. Finally, in step 104, the remaining resist is stripped from the remaining masked electrode regions on the front planar electrode surface and rear pixilated electrode surfaces. At this step, any remaining contact material on., the tile sides can be removed, typically by polishing, and a common protective coating added. The combined effect of the method is a high performance radiation detector device as is demonstrated herein.

FIG. 2 illustrates an example of a detailed method in accordance with the invention, of forming tri-layer metal contacts on a semiconductor substrate at positions (pixels) for defining radiation detector cells with an interpixel gap with high resistivity between the detector cells. In this example it is assumed that the semiconductor substrate is made of cadmium zinc telluride (CdZnTe) or cadmium telluride (CdTe), although it will be appreciated that other semiconductor materials, for example lead iodide, thallium bromide, gallium arsenide or silicon, can be used. Also, it will be assumed that the metal used for the metallization layer and the contacts is gold, although it will be appreciated that other metals, alloys or other conductive materials, for example platinum or indium, could be used.

Thus, FIG. 2 is a schematic cross-sectional view from the side of a detector substrate at various stages in the formation of gold contacts on a CdZnTe substrate. The detailed features and structure at each step of the process are shown, resulting in an array of contact pixels on the rear surface of the CZT (drawn as facing up in this illustration), protective side coatings, and a single electrode on the front surface of the CZT tile (drawn as facing down in this illustration). In this example, two additional contact layers are added on to the pixilated primary contact layer on the rear side, for improved device assembly. The steps of the process are detailed in FIG. 3. The process can be applied to any array size and pixel configuration for CZT devices. A typical device size is a 20×20×5 mm detector, having 8×8 pixels or 11×11 pixels depending on the application. As a precursor to contact fabrication, the CZT wafer is polished and etched such that high quality clean crystal surfaces are prepared for the deposition process.

Figure 3:
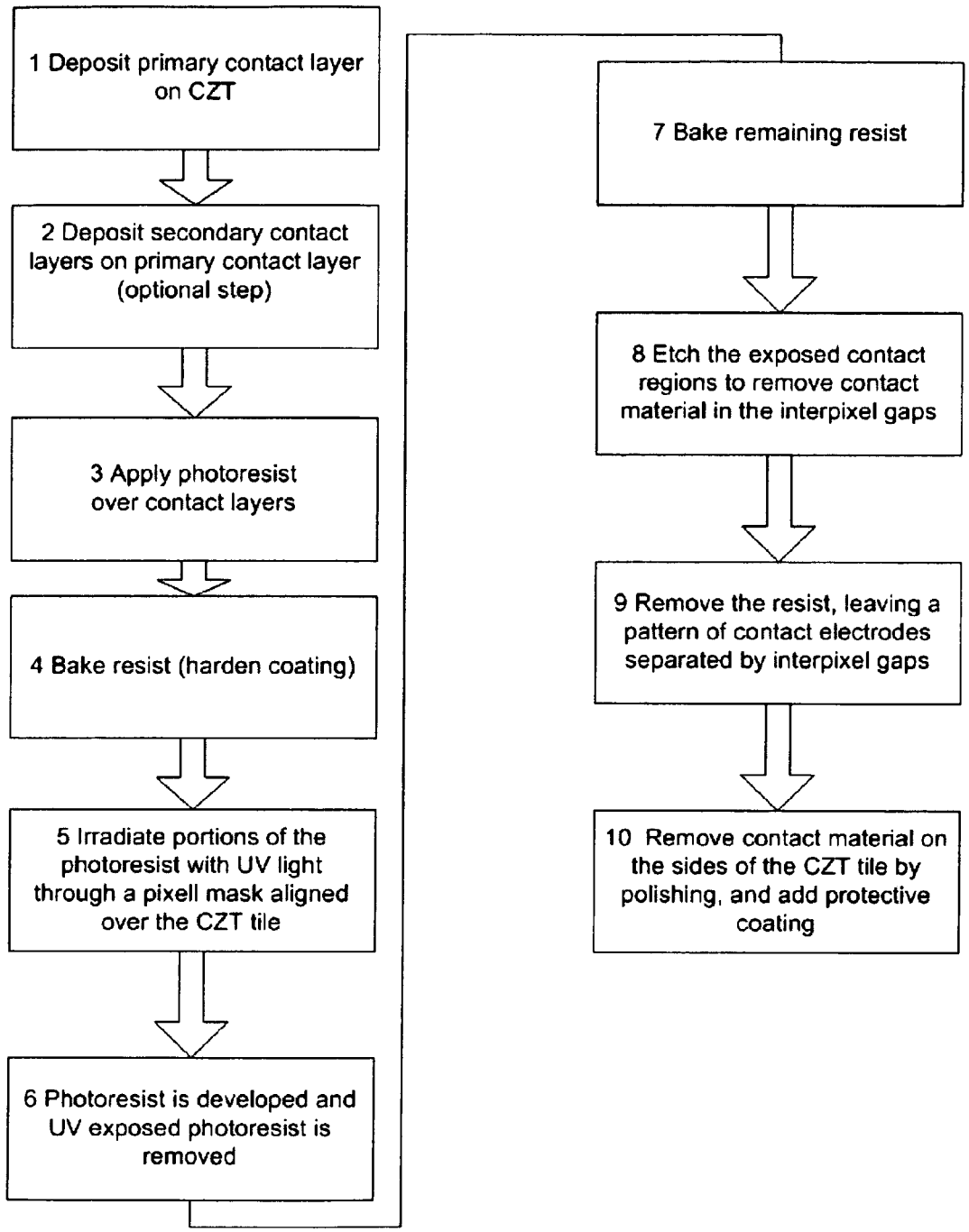
FIG. 3: DETAILED ELECTRODE FABRICATION METHOD USING DIRECT PHOTOLITHOGRAPHY: This figure shows method steps corresponding to FIG. 2.

The direct lithography fabrication process is described with reference to both FIGS. 2 and 3, and for the case of the primary contact being gold, with two additional contact layers and for simultaneous forming of the cathode contact on the opposing side of the CZT tile.

In step 1, a primary layer of gold 200 is deposited on the CZT tile 304. The devices described used electroless deposition, but alternatively the gold may be deposited by known techniques, such as sputtering. The CZT tiles are first cleaned in acetone, as is well known. The clean CZT tiles 304 are dipped in an electroless gold solution for several minutes depositing a gold layer 200, then the tile is removed and rinsed with methanol. Typical thickness of deposition is equal or more than 100 nm. The deposited gold may be annealed at 90 deg C. for 15 minutes to increase adhesion to the substrate. An adhesion test can be done after a few hours using Scotch tape to confirm quality of the adhesion.

In step 2 (an optional step), two additional contact layers are deposited onto the rear (side to be pixilated) side of the tile, over the primary contact on the rear side. In this example, a Ni layer 312 is deposited using sputtering or a thermal evaporation process to a thickness <100 nm and nominally 50 nm. Then gold layer 310 is deposited using sputtering, thermal evaporation and/or an electroless process to a thickness <50 nm and nominally 20 nm. Alternative conductive contact material can be substituted for either or both of the additional contact layers.

In step 3, a photoresist 202 is applied over the contact layer(s). Tiles 304 are dipped in resist, for example Shipley 1805 resist. Excessive resist is removed if necessary from the edge using a Q-tip, making sure the resist does not form any edge bead (especially on the pixilated face) as this would be detrimental for the pixel quality. Generally, the least possible amount of resist should remain on the pixilated face. The resist should be dried out for 10 minutes with the pixilated face kept up and horizontal.

The resist coating is hardened in step 4 by baking for 10 minutes at 90° C. This step is done to drive excess solvent out of the resist. The tile is now prepared for lithography exposure.

In step 5, a pixel pattern is formed on the rear side of the tile 304 by photolithography. A UV mask 204 is aligned over the CZT tile surface, and the negative resist is exposed to UV. The direct lithography mask shades regions of the resist in a selected pixel pattern and exposes interpixel gaps to UV radiation. A contact mask is used but other methods will work as well, such as proximity and projection masks. A glass plate is placed on top making sure that the glass plate is horizontal. This ensures uniform contact between the tile and the mask. For the example resist, exposure by a UV lamp (254 nm wavelength) for several minutes is suitable. If desired, a positive resist may be used instead of the negative resist (in which case, the exposure mask's transparent and opaque regions are reversed).

In step 6 the exposed photoresist is developed. The resist developer (for example Microposit developer, MF-319) should cover the tile(s). The tiles are placed into the developer with the pixilated side facing up, developed for 2 minutes and the tile(s) are removed from the developer and rinsed in de-ionized water. The UV exposed resist is removed, in preparation for creating the interpixel gap.

In step 7 the remaining resist (pixel pattern) is baked for 20 minutes at 90° C. This step is done to harden the resist further.

In step 8, the exposed contact regions 316 (not covered by the pixel resist pattern 314) are etched. For the example contact materials, the following etching solution is suitable for etching through either just the primary contact layer or the optional three-layer contact. A 2% Br-Ethanol Glycol (BrEG) solution is prepared by pouring a 25 ml of Ethylene Glycol into a plastic beaker, then 0.5 ml of Bromine is added using a disposable pipette. Using the same pipette, the solution is mixed thoroughly until it becomes uniform. However, a different pipette or mixing device may also be used. Etching is conducted for approximately 3 minutes. This etching is done to remove unmasked interpixel contact material. To open the interpixel gap to achieve clean interpixel gaps, active spray agitation is performed. Disposable pipettes can be used to create Br-EG constant flow to agitate for better etching. However, a different pipette or agitation or mixing device may also be used. The spray etching technique should rapidly remove contact material flakes from the interpixel gaps, resulting in high interpixel resistance. The tiles are removed from the etchant and rinsed in deionized water. In step 9, the remaining resist is stripped using an acetone bath, resulting in tile 320 with a pixel array of contacts. No photoresist therefore remains on the CdTe/CdZnTe detector since it is usually a hydroscopic material that in time would absorb humidity and deteriorate the detector performance.

The overall combination of depositing the metal layer over the entire substrate surface at once, direct photolithography and the etching process results in the improved device interpixel resistance and performance.

In step 10, the primary contact material (in this example gold) on the sides of the fabricated CZT device 322 is removed by side polishing. For example, the side of the tile(s) are first polished with 1200 grit then with 0.3 micron as fine polish. An alternate embodiment could, in step 1, mask the sides of the CZT tile instead of depositing gold on all sides. For this reason, the side contact removal step 10 may be optional. The resulting fabricated CZT device has a cathode contact 200 remaining on the front side, a pixilated anode contact array formed of a primary contact 200, and secondary contact layers 312 and 310, separated by interpixel gap 316. FIG. 2 illustrates the multi-layer pixels as being identical width in cross-section for illustrative purpose. The preferred embodiment is that the secondary contact layers are smaller in area than the primary contact pixel, as shown in FIG. 4. This can be realized by applying the secondary contacts via sputtering.

Typically, as is common in device fabrication, a protective coating is applied to the polished side edges shown as coating 308 FIG. 4a. The CZT tile is dipped in a protective coating (such as Humiseal) to cover the exposed sides and dried for at least 5 hours.

The structure of the fabricated CZT detector devices 300, are shown in FIG. 4a-c. In FIG. 4a, monolithic CZT crystal 304 has a planar contact electrode 306 on a front side and an array of pixel contact electrodes 302 on a rear side separated by interpixel gaps 316. This is the basic example with only one contact layer. The side edges have no electrode layer, and the CZT surface is polished and sealed by coating 308. A cutaway is shown in perspective view in FIG. 4b showing an array of pixels suitable for radiation detection.

In FIG. 4c, an alternate embodiment of the contact structure 84 is shown for detector device 80 fabricated by the techniques described herein, with pixel contacts 84 separated by interpixel gap 316 between each pixel. Sectional view A in FIG. 4d shows an expanded view of one pixel electrode, showing two additional metal coatings 312 and 310 fabricated on a section (for example 50% smaller than the area of the contact electrode 302) of the pixel contact electrode 302 surface. The tri-layer contact electrodes are for the purpose of providing an enhanced and reliable electrical contact to electrode 302 for applying voltage across the detector device electrodes 302 and 306. Thus, each anode electrode in FIGS. 4c and 4d comprises a gold contact layer 302 contacting the substrate, a nickel layer 312 having a thickness of at least 50 nm and another gold layer 310 having a thickness of at most 50 nm.

The trilayer electrode may be formed by forming another photoresist pattern on a surface of said pixilated anode electrode array with openings to said array surface that are equal or less than an area of each pixel anode electrode 302, depositing the second conductive layer 312 and the third conductive layer 310 over the photoresist pattern, and removing the photoresist pattern to lift off portions of the second and third conductive layers to form an array of trilayer pixel anode electrodes in which the first conductive layer portion 302 is wider than the second 312 and third 310 conductive layer portions in each pixel.

Figure 5A:
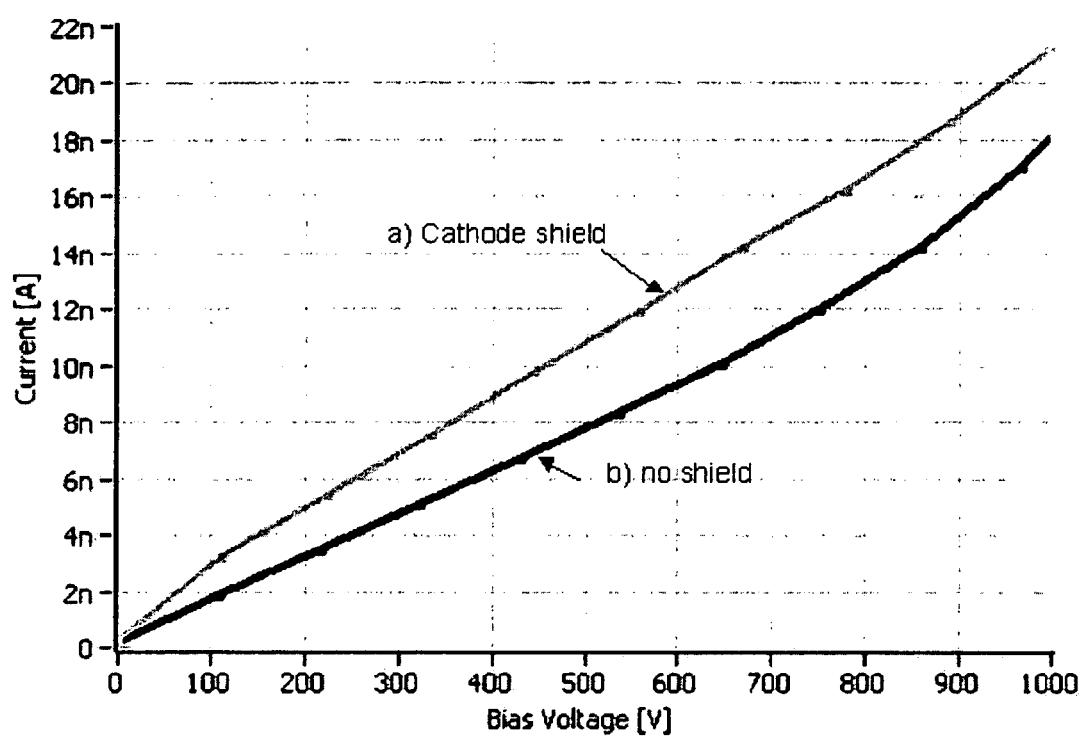
FIG. 5: ELECTRICAL CHARACTERISTICS OF CZT DEVICE USING ELECTRODE FABRICATION METHODS: This figure shows in a) an I-V curve showing the blocking nature of the metal contact, and in b) a resistivity curve for the CZT device.
Figure 5B:
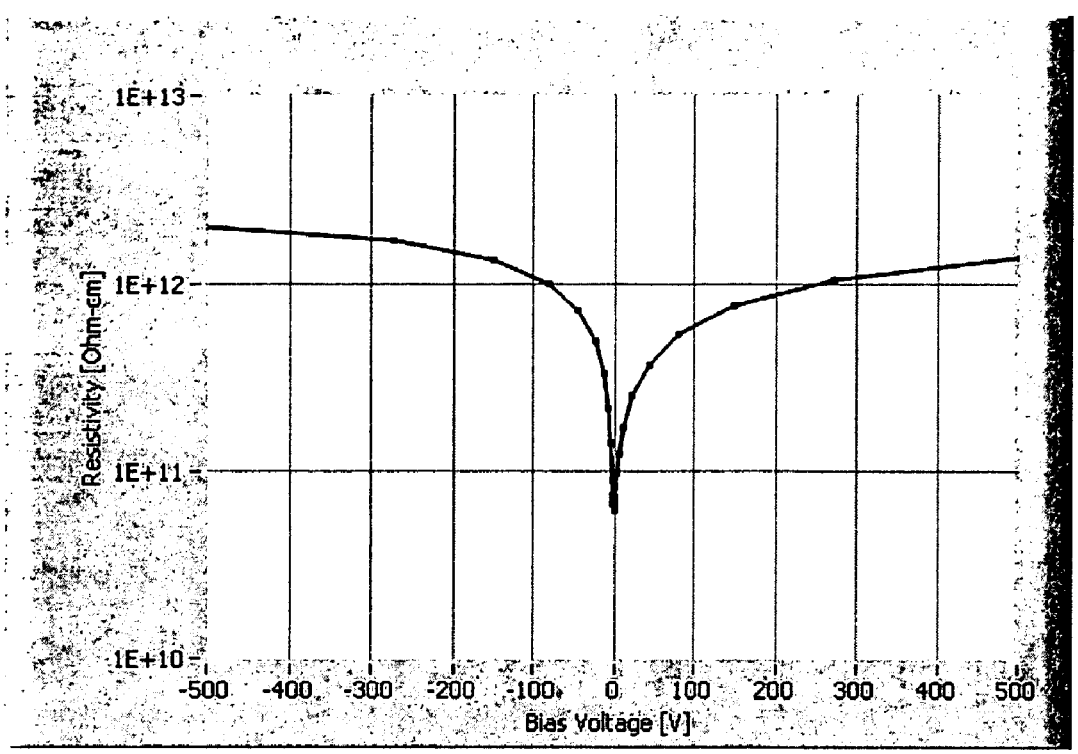

FIG. 5 shows the electrical characteristics of CZT detector devices having electrodes fabricated by the taught embodiments. The I-V curve in FIG. 5a, demonstrates the blocking nature of the deposited gold metal contact, as well as low total device leakage current. The device resistivities are derived from the I-V curve and shown in FIG. 5b. It can be seen that device resistivity measured at 100V bias is greater than $5 \times 10^{10}$ Ω-cm, such as greater than about $10^{11}$ Ω-cm, and bulk resistivity at the ~1V region remains high also.

Figure 6:
FIG. 6: RADIATION DETECTOR SPECTRAL PERFORMANCE: This figure shows experimental data for the energy resolution response of an 8×8 pixel detector device fabricated by the embodied methods.

The performance of CZT detector devices 300 resulted in improved devices, faster fabrication methods and lower cost fabrication methods. For example, interpixel resistance improved from less than or equal to $10^8$ Ohm to greater than $2 \times 10^9$ ohm, due to the contact structures fabricated by the methods described herein. Additionally the fabrication method leads to improved yield of responsive pixels within the CZT detector device 300. All 64 pixels of an 8×8 array produced ER signals using the traveling heater method (THM) grown CZT bulk crystal under standard radiation testing. FIG. 6 shows the energy resolution results demonstrating that all 64 pixels provide excellent signal, and all have FWHM <5.5%, such as 3.7 to 5.4% for each pixel. The resulting device demonstrated device resistivity greater than about $10^{11}$ Ω-cm, interpixel resistance greater than $2 \times 10^9$ Ohm, which is believed to be significantly better than the prior art values. The method and proves uniform and reliable across all gold tile electrodes treated on the CZT detector device—i.e. yield of quality electrodes is 100%, which is a dramatic improvement over known commercial devices. The adhesion properties of the gold electrodes to the CZT are exceptional, and pass the Scotch tape (3M brand) adhesion test per standard ASTM testing methodology with 100% yields (Test Reference: with respect to the ASTM D3330/D3330M-04 Standard test method for peel adhesion of pressure-sensitive tape: Under Test Method A standard conditions the particular tape used to test the adhesion (3M—BP2018) gives a result of 22 oz. on a 1.0" wide front per 3M Company Inc).

Figure 7:
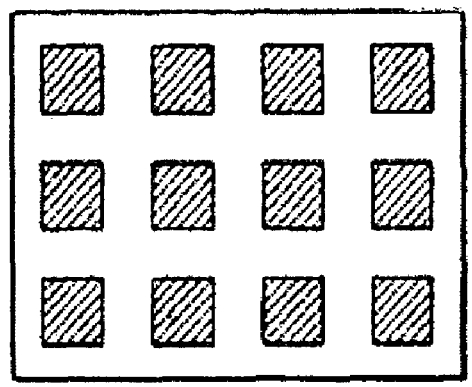
FIG. 7: is a schematic plan view of on contact configuration on a detector substrate.
Figure 8:
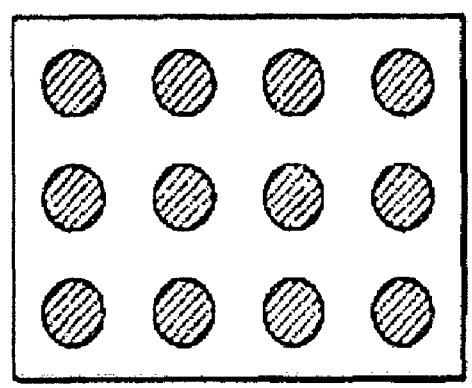
FIG. 8: is a schematic plan view of another contact configuration on a detector substrate.
Figure 9:
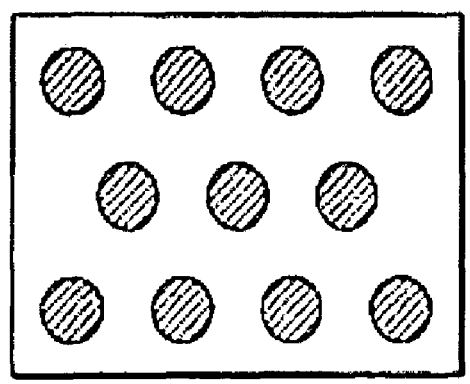
FIG. 9: is a schematic plan view of a further contact configuration on a detector substrate.

FIGS. 7, 8 and 9 are used to illustrate possible pixel contact patterns on the upper surface of the detector substrate. In FIG. 7, an array of square pixel contact pads is shown, as is commonly used. In FIG. 8 an array of circular pixel pads is shown. The use of circular rather than square pixel pads increases the surface resistance between pads by increasing the amount of resistive material between adjacent pads. FIG. 9 illustrates an array of offset honeycombed pixel pads. Once again this further increases the resistance between pads by increasing the surface amount of resistive material between adjacent pads. However these patterns are included as possible examples. Devices fabricated by the method do not require additional resistive material or gap, which would reduce spatial resolution of the detector.

Figure 10:
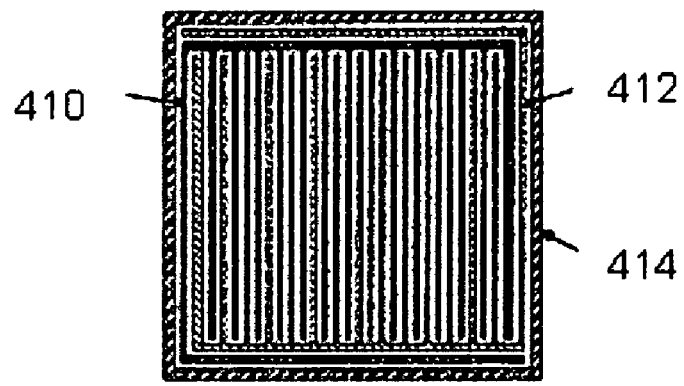
FIG. 10: is a schematic plan view of a further contact configuration of a coplanar grid design with two interlocking anode patterns on a detector substrate.

An alternate contact configuration is shown in FIG. 10 of a coplanar grid design with two interlocking anode patterns on a detector substrate. Coplanar anode 410 is interspersed between the fingers of coplanar anode 412. Both are surrounded by boundary electrode 414. The spacing between anode fingers is the effective interpixel gap. The detector configuration may be fabricated by the direct photolithography process.

Figures 11A, 11B:
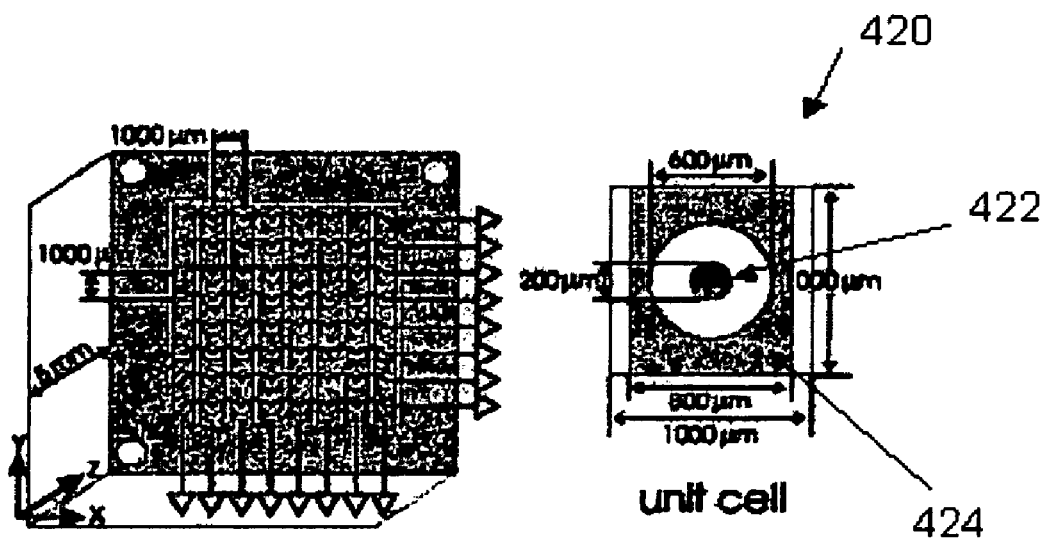
FIG. 11: a) is a perspective view of a further contact configuration of a strip detector with orthogonal coplanar anode strips on a detector substrate and b) is a top view of one unit cell.

A strip detector with orthogonal coplanar anode strips on a detector substrate is shown in FIG. 11. Each anode cell 420 has a collecting pixel 422 and non-collecting portion 424, which are connected in orthogonal directions as shown. The effective interpixel region is the gap surrounding the collecting pixel. The dimensions are for illustration, as will be appreciated by one skilled in the art, a wide range of dimensions can be applied to the same configuration. A detector type as shown in FIG. 11 can be fabricated by the direct photolithography process.

Figures 12A, 12B:
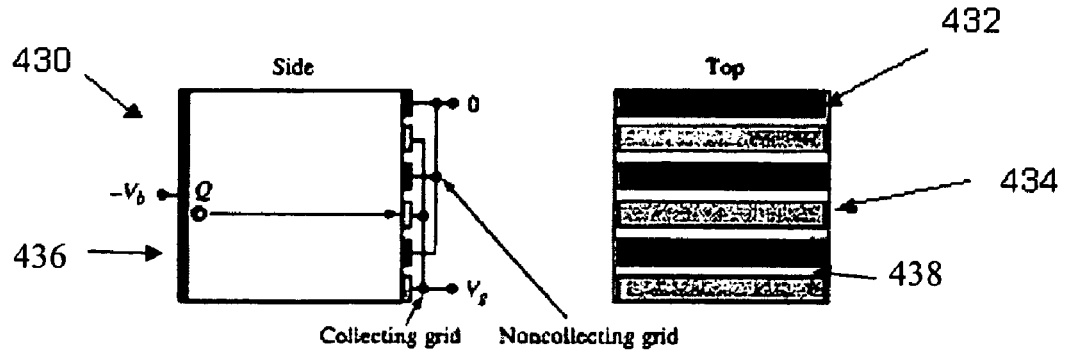
FIG. 12: a) is a side view and b) is a top view of a further contact configuration with coplanar anode strips on a detector substrate and a unitary cathode.

A coplanar grid detector 430 is shown in side and top views in FIGS. 12a and 12b with coplanar anode strips (432,434 in the top view) on a detector substrate and a unitary cathode 436. The effective "interpixel gap" is the region 438 separating adjacent anode strips. A detector type as shown in FIG. 12 can be fabricated by the direct photolithography process.

Figure 13:
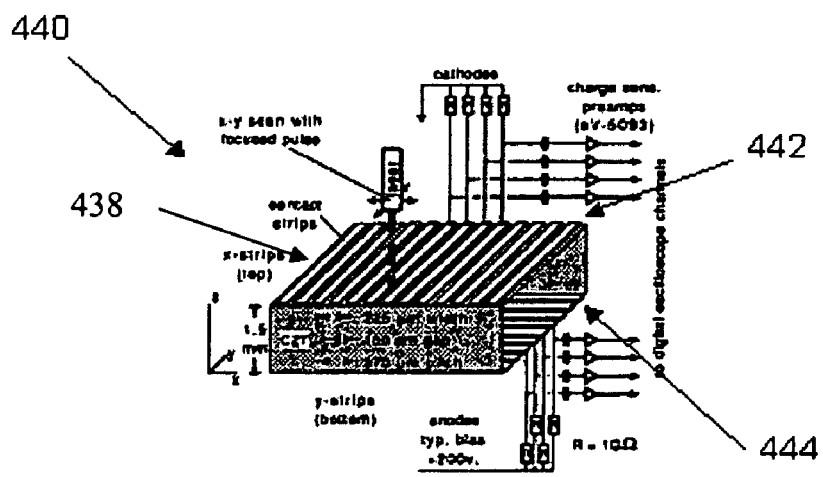
FIG. 13: is a perspective view of a further contact configuration of a strip detector with coplanar anode strips and orthogonal cathode strips on a detector substrate.

Another strip detector 440 is shown in FIG. 13 having coplanar anode strips 442 and orthogonal cathode strips 444 on a detector substrate. The effective "interpixel gap" is the region 438 separating adjacent anode strips. The dimensions and electronics are for illustration and are not limiting to the example, as will be appreciated by one skilled in the art. A wide range of dimensions can be applied to the same configuration. The detector type as shown in FIG. 13 can be fabricated by the direct photolithography process.

Figure 14A:
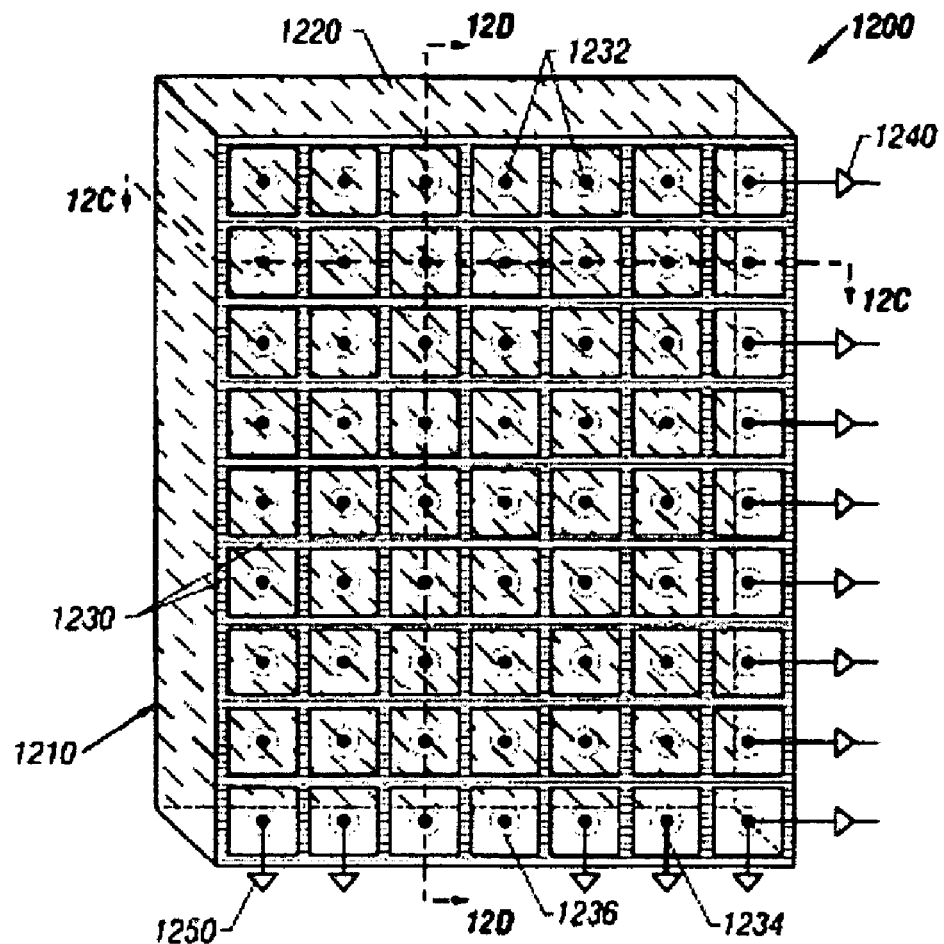
FIG. 14: a) is a perspective view of a further contact configuration of a strip detector with an additional interpixel grid and b) is a top view of one cell.
Figure 14B:
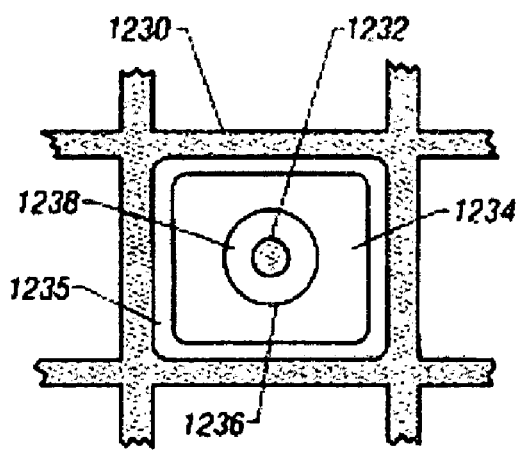

A cross-strip radiation-detector 1200 is shown in FIGS. 14a and 14b, as referenced from U.S. Pat. No. 6,037,595. An expanded cell in FIG. 14b shows the detailed electrode construction of each detection element. A first surface of a slab of semiconductor crystal 1210 has a continuous layer of conducting material to form a bias electrode 1220. If the mobility-lifetime product of the electrons is larger than that of the holes for the semiconductor 1210, the bias electrode 1220 is the cathode. On the second surface opposing the first surface, an array of anode detection elements is formed. The anode array includes typically three sets of electrodes: a control electrode grid 1230, a plurality of small "dot"-like anode electrodes 1232, and shield electrodes 1234.

The control electrode grid 1230 is preferably formed by two mutually orthogonal and intersecting sets of thin parallel conducting lines plated on the surface of the semiconductor 1210 to form open anode areas around anodes 1232. At the center of each anode area, a small anode 1232 is formed on the surface of the semiconductor (e.g., by plating). The shield electrode 1234 substantially fills the open anode area but with a small gap 1235 to provide electrical insulation to the control grid 1230. The shield electrode 1234 has a center opening which generally surrounds the anode 1232. Preferably, the opening 1236 is as small as possible but still large enough to provide a gap 1238 which insulates the anode 1232 from the shield electrode 1234. The gaps 1235 and 1238 may be filled with a dielectric material to improve the electrical insulation. The dimensions and electronics are for illustration and are not limiting to the example, as will be appreciated by one skilled in the art. A wide range of dimensions can be applied to the same configuration. The detector type of FIG. 14 can be fabricated by the direct photolithography process.

There are several alternate embodiments. Optionally, various shaping/shielding ring configurations as are common in the CZT detector industry can be used with the device to further enhance performance. It is possible to apply the resist only to the rear surface of the wafer 304 where the pixels will be formed by an additional step of applying protective coating to the remainder of the CZT tile 304 prior to gold plating and resist application. This method could apply when the opposing planar electrode deposition is done separately such as by another deposition process.

The method can be also used for fabrication of an integrated shielding cathode, with a configuration as described in co-pending patent applications "Segmented radiation detector with side shielding cathode" (U.S. application Ser. No. 11/527,707 filed Sep. 27, 2006 and Canadian application number 2,541,256, filed on Feb. 22, 2006).

It will be appreciated that rather than providing an array of contacts for defining an array of pixel detector cells, other contact configurations, for example contact strips for defining strip-shaped detector cells, can be obtained with the same method.

Reference has been made to the use of gold for the contacts. Gold is an advantageous material because it can be readily etched to define the desired contact structures and give good contact (better than aluminum, for example) to the CdZnTe. However, it is apparent that the procedure disclosed above could also be applied to any kind of conductive material or metal contacts (e.g. platinum, nickel, aluminum, nickel/gold alloy, platinum/gold alloy, titanium/tungsten or cadmium sulfide) in combination with an appropriate etchant.

A radiation imaging device can be constructed by connecting a radiation detector produced by the method according to one of the above described methods to a readout chip having circuits for accumulating charge from successive radiation hits, individual contacts (e.g. pixel pads) for respective detector cells being 'flip-chip' joined (e.g., by bump bonding using balls of indium or conductive polymer material, gluing using one-way conductive materials, or other conductive adhesive layer techniques) to respective circuits for accumulating charge.

Thus, the invention teaches how to obtain a radiation detector (e.g. based on a CdZnTe substrate) with one side metallized according to a desired pattern with maximum possible electrical resistivity separation between the metal contacts. High resistivity between metal contacts is desirable to improve contrast resolution and eliminate signal leakage between adjacent metal contacts on the substrate surface.

Although particular embodiments of the invention have been described by way of example, it will be appreciated that additions, modifications and alternatives thereto may be envisaged. The scope of the present disclosure includes any novel feature or combination of features disclosed therein either explicitly or implicitly or any generalization thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

What is claimed is:

1. A method of making a semiconductor radiation detector, comprising:
   a) providing a semiconductor single crystal substrate comprising first and second major planar opposing surfaces;
   b) forming a pixilated anode electrode array on the first major opposing surface by direct lithography; and
   c) forming a cathode electrode on the second major opposing surface.

2. The method of claim 1, wherein the step b) of forming the pixilated anode electrode array on the first major opposing surface by direct lithography comprises:
   i) forming at least one conductive layer over at least said first major substrate surface, which comprises a rear substrate surface;
   ii) forming a masking layer over the at least one conductive layer;
   iii) patterning the masking layer to form openings to said at least one conductive layer; and
   iv) removing exposed portions of the at least one conductive layer that are exposed in the openings in the masking layer to form the pixilated anode electrode array comprising pixel anode electrodes separated by interpixel gap regions with no oxide remaining in the interpixel gap regions on the substrate.

3. The method of claim 2, wherein:
the masking layer comprises a photoresist layer; and
patterning the masking layer comprises photolithgraphically patterning the photoresist layer by selectively exposing the photoresist layer to radiation and removing exposed portion of the photoresist layer.

4. The method of claim 2, wherein said at least one conductive layer is a metal or metal alloy layer.

5. The method of claim 4, wherein said metal or metal alloy comprises nickel, gold, platinum, indium, nickel/gold alloy, titanium/tungsten alloy or platinum/gold alloy.

6. The method of claim 5, wherein said metal is gold.

7. The method of claim 6, wherein the step of removing exposed portions of the at least one conductive layer comprises etching said exposed portions with a bromine-based etchant to remove substantially all deposited gold in the interpixel gap regions.

8. The method of claim 7, wherein the step of etching comprises spray etching to remove gold flakes in the interpixel gap regions.

9. The method of claim 2, wherein the step of removing exposed portions of the at least one conductive layer comprises spray etching said exposed portions.

10. The method of claim 2, wherein in step i) all substrate surfaces are coated with the at least one conductive layer.

11. The method of claim 10, further comprising:
removing the at least conductive material from the substrate sides; and
applying a protective encapsulant coating to at least the sides of said substrate.

12. The method according to claim 10, further comprising patterning the first layer to form the cathode electrode on the second surface of the substrate.

13. The method of claim 2, wherein each anode electrode comprises a gold contact layer contacting the substrate, a nickel layer having a thickness of at least 50 nm on the contact layer, and another gold layer having a thickness of at most 50 nm on the nickel layer.

14. The method of claim 13, further comprising:
forming a photoresist pattern on a surface of said pixilated anode electrode array with openings to said array surface that have a size that is equal or less than an area of each pixel anode electrode;
depositing the second conductive layer and the third conductive layer over the photoresist pattern; and
removing the photoresist pattern to lift off portions of the second and third conductive layers to form an array of trilayer pixel anode electrodes in which the first conductive layer portion is wider than the second and third conductive layer portions in each pixel.

15. The method of claim 2, wherein device resistivity is $>5 \times 10^{10} \Omega$-cm, interpixel resistance is $>2 \times 10^9 \Omega$, and an energy resolution is FWHM <5.5% for each pixel.

16. The method according to claim 1, wherein step c) is performed prior to step b).

17. The method of claim 1, wherein each anode electrode of the array of the pixilated anode electrodes defines a respective segmented cell of an array of segmented cells.

18. The method of claim 17, further comprising individually connecting individual detector cell contacts for respective detector cells to corresponding circuits on a readout chip by a flip-chip technique.

19. The method of claim 1, wherein the substrate material comprises Cadmium Zinc Telluride or Cadmium Telluride.

20. The method of claim 1, wherein anode electrodes of the anode electrode array comprise blocking type contacts with substantially no oxide layer between the electrodes and the substrate.

21. A radiation detector device, comprising:
a) a high resistivity, flat CZT bulk crystal substrate, formed as a substantially flat wafer substrate having front and rear surfaces;
b) a segmented array of pixellated anode electrodes comprising a metal or metal alloy contact layer formed on the rear substrate surface such that substantially all metal or metal alloy material in interpixel gaps between the anode electrodes is removed, wherein substantially no oxide layer is present between the substrate and the metal or metal alloy contact layer; and
c) a cathode electrode formed on the front substrate surface;
wherein device resistivity is $>5 \times 10^{10} \Omega$-cm and interpixel resistance is $>2 \times 10^9 \Omega$.

22. The device of claim 21, wherein the CZT substrate is made from a compound comprising $Cd_{(1-x)} Zn_x Te$, where $0 \leq x \leq 1$, and a donor dopant selected from a Group III element and a Group VII element of the periodic table in a concentration between 10 to 10,000 parts per billion.

23. The device of claim 21, wherein each anode electrode comprises a gold contact layer contacting the substrate, a nickel layer having a thickness of at least 50 nm on the contact layer and another gold layer having a thickness of at most 50 nm on the nickel layer.

24. The device of claim 21, wherein said CZT substrate is substantially rectangular and the anode electrodes are configured in a segmented array of m×n pixels.

25. The device of claim 21, wherein the device exhibits an energy resolution comprising FWHM <5.5% for each pixel.

26. The device of claim 21, wherein said anode electrodes are arranged in one of the following patterns:
(a) a coplanar grid of two interlocking anode electrode patterns;
(b) a grid comprising coplanar anode strip contacts and further comprising a single cathode contact;
(c) orthogonal coplanar anode strips;
(d) coplanar anode strip contacts and further comprising cathode strip contacts arranged orthogonal to said anode strip contacts; or
(e) a cross strip detector configuration comprising control electrode contacts, plurality of anode electrode contacts and shield contacts.

27. The device of claim 21, wherein said metal or metal alloy comprises nickel, gold, platinum, indium, nickel/gold alloy, titanium/tungsten alloy or platinum/gold alloy.

28. The device of claim 21, wherein no oxide is located in interpixel gap regions.

29. A method of making a semiconductor radiation detector, comprising:
(a) providing a semiconductor single crystal substrate comprising first and second major planar opposing surfaces;
(b) forming a pixilated anode electrode array on the first major opposing surface by direct lithography; and
(c) forming a cathode electrode on the second major opposing surface;
wherein device resistivity is $>5 \times 10^{10} \Omega$-cm and interpixel resistance is $>2 \times 10^9 \Omega$, and wherein no oxide remains in interpixel gap regions on the substrate.

* * * * *